(12) United States Patent
Kim

(10) Patent No.: US 9,028,987 B2
(45) Date of Patent: May 12, 2015

(54) SEMICONDUCTOR DEVICE FOR PROTECTING BATTERY CELL, PROTECTION CIRCUIT MODULE AND BATTERY PACK HAVING THE SAME

(75) Inventor: Bongyoung Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1139 days.

(21) Appl. No.: 12/947,797

(22) Filed: Nov. 16, 2010

(65) Prior Publication Data

US 2011/0123842 A1      May 26, 2011

(30) Foreign Application Priority Data

Nov. 26, 2009 (KR) .................... 10-2009-0115144

(51) Int. Cl.
| | | |
|---|---|---|
| H01M 4/00 | (2006.01) | |
| H02J 7/00 | (2006.01) | |
| H01M 10/0525 | (2010.01) | |
| H01M 10/42 | (2006.01) | |
| H01M 10/48 | (2006.01) | |

(52) U.S. Cl.
CPC ......... H02J 7/0031 (2013.01); H01M 10/0525 (2013.01); H01M 10/4257 (2013.01); H01M 10/482 (2013.01); Y02E 60/122 (2013.01)

(58) Field of Classification Search
USPC .............................................. 429/7; 327/419
See application file for complete search history.

(56) References Cited

U.S. PATENT DOCUMENTS

| | | | |
|---|---|---|---|
| 7,038,150 B1* | 5/2006 | Polosky et al. | 200/61.45 R |
| 7,126,310 B1* | 10/2006 | Barron | 320/108 |
| 2002/0031032 A1* | 3/2002 | Ooishi | 365/226 |
| 2007/0222417 A1* | 9/2007 | Kim et al. | 320/134 |
| 2008/0125826 A1* | 5/2008 | Belalcazar et al. | 607/17 |
| 2008/0197476 A1* | 8/2008 | Sunaga | 257/690 |
| 2009/0195215 A1* | 8/2009 | Sato et al. | 320/150 |
| 2012/0121942 A1* | 5/2012 | Kim | 429/7 |
| 2013/0158614 A1* | 6/2013 | Azar et al. | 607/6 |

FOREIGN PATENT DOCUMENTS

| | | |
|---|---|---|
| JP | 2001-135361 | 5/2001 |
| JP | 2006-304487 | 11/2006 |
| JP | 2007-305451 | 11/2007 |
| KR | 10-2007-0096647 A | 10/2007 |

OTHER PUBLICATIONS

Korean Office Action dated Apr. 4, 2011, issued by KIPO corresponding to Korean Application No. 10-2009-0115144, 3 pages.
English Machine Translation of of Japanese Publication 2006-304487 listed above, 21 pages.
Machine English Translation for JP 2007-305451.
Machine English Translation for JP 2001-135361.

* cited by examiner

*Primary Examiner* — Cynthia H Kelly
*Assistant Examiner* — Monique Wills
(74) *Attorney, Agent, or Firm* — Christie, Parker & Hale, LLP

(57) ABSTRACT

A semiconductor device is provided. The semiconductor device includes an integrated circuit that senses a voltage of a battery cell and outputs a control signal; a charge switch that is electrically coupled to the integrated circuit and interrupts a charge path according to the control signal output from the integrated circuit; at least one first lead electrically coupled to the integrated circuit; a second lead electrically coupled to the charge switch; and a sealing portion that seals the integrated circuit, charge switch, the at least one first lead and the second lead.

17 Claims, 4 Drawing Sheets

SEMICONDUCTOR DEVICE FOR PROTECTING BATTERY CELL, PROTECTION CIRCUIT MODULE AND BATTERY PACK HAVING THE SAME

CROSS-REFERENCE TO RELATED APPLICATION

This application claims priority to and the benefit of Korean Patent Application No. 10-2009-0115144, filed on Nov. 26, 2009, the entire content of which is incorporated herein by reference.

BACKGROUND

1. Field

On or more embodiments of the present invention relate to a semiconductor device for protecting a battery cell, a protection circuit module, and a battery pack having the semiconductor device for protecting a battery cell.

2. Description of Related Art

In general, lithium-based secondary batteries, such as lithium ion batteries or lithium polymer batteries, have higher energy densities and smaller weights than Pb storage batteries, Ni—Cd batteries, or Ni—H batteries. Thus, the lithium-based secondary batteries are widely used as power sources for portable electronic devices, such as notebook computers, mobile phones, personal digital assistants (PDAs), and other typical electronic devices.

However, such lithium-based secondary batteries are unstable in chemical composition, and there is an increased risk of danger, such as leakage, explosion, fire, or the like due to malfunction, such as perforation, compression, external short, overcharge, overdischarge, heat, drop, or cutting. Thus, in order to protect the secondary battery from overcharge, overdischarge, or over-current, or prevent the secondary battery from deteriorating in its performance, a protection circuit module (PCM) may be mounted in the battery when fabricating a battery pack.

SUMMARY

Aspects of embodiments of the present invention are directed to a semiconductor device for protecting a battery cell, a protection circuit module, and a battery pack using the protection circuit module, which achieve a compact sized battery pack by eliminating an overdischarge switch while increasing the integration density.

Other aspects of embodiments of the present invention are directed to a semiconductor device for protecting a battery cell, a protection circuit module, and a battery pack using the protection circuit module, which can reduce the manufacturing cost by eliminating an unnecessary overdischarge switch from battery design.

An embodiment of the present invention provides a semiconductor device including an integrated circuit configured to sense a voltage of a battery cell and to output a control signal, a charge switch electrically coupled to the integrated circuit and configured to interrupt a charge path according to the control signal output from the integrated circuit, a first lead electrically coupled to the integrated circuit, a second lead electrically coupled to the charge switch, and a sealing portion that seals the integrated circuit, charge switch, the a first lead, and the second lead.

The integrated circuit and the charge switch may be coupled to each other by at least one conductive wire, the integrated circuit and the first lead may be coupled to each other by at least one conductive wire, and the charge switch and the second lead may be coupled to each other by at least one conductive wire.

The first lead and the second lead may protrude outside the sealing portion. In addition, the at least one first lead may include a first sub lead for supplying power to the integrated circuit, and a second sub lead for supplying a voltage of the battery cell. Here, the first sub lead may be arranged at one side of the sealing portion, and the second sub lead and the second lead may be aligned with each other at the other side of the sealing portion facing the first sub lead. The first sub lead may be electrically coupled to a battery terminal and a pack terminal, and the second sub lead may be electrically coupled to the pack terminal. In addition, the second lead may be electrically coupled to the pack terminal.

The sealing portion may include an integrated circuit mounting board and the integrated circuit may be mounted on the integrated circuit mounting board. The first mounting board may be coupled to the integrated circuit using an insulating adhesive. The sealing portion may include a charge switch mounting board and the charge switch may be mounted on the charge switch mounting board. The charge switch mounting board may be coupled to the charge switch using a conductive adhesive. The charge switch mounting board may protrude outside the sealing portion.

The sealing portion may further include a dummy lead. The dummy lead may protrude outside the sealing portion. The dummy lead may be formed at the same side of the sealing portion as the first sub lead of the sealing portion.

Another embodiment of the present invention provides a battery pack including a protection circuit module including the aforementioned semiconductor device, the semiconductor device being mounted on a printed circuit board, and a battery cell electrically coupled to the protection circuit module.

The printed circuit board may further include a battery terminal electrically coupled to the battery cell, and a pack terminal electrically coupled to an external system.

Additional aspects and/or advantages of the invention will be set forth in part in the description which follows and, in part, will be obvious from the description, or may be learned by practice of the invention.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
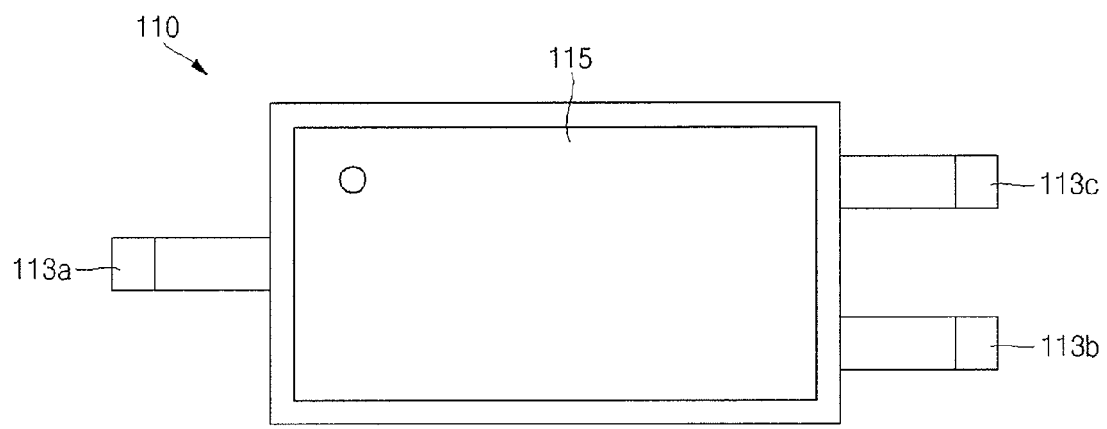
FIG. 1A shows a plan view of a semiconductor device for protecting a battery cell according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. In addition, it will also be understood that when a layer is referred to as being "between" two layers, it may be the only layer between the two layers, or one or more intervening layers may also be present.

The protection circuit module includes an integrated circuit, charge/discharge switches, and multiple passive elements. The protection circuit module interrupts charging when the secondary battery is overcharged, and interrupts discharging when the secondary battery is overdischarged, thereby protecting the secondary battery.

As described above, in the semiconductor device for protecting a battery cell, the protection circuit module, and the battery pack having the protection circuit module, according to embodiments of the present invention, an overdischarge switch is not required (or necessary), increasing the integration density of the semiconductor device and miniaturizing the semiconductor device.

According to aspects of embodiments of the present invention, the manufacturing cost of the semiconductor device can be reduced by eliminating an unnecessary overdischarge switch from the battery components.

When NCM (nickel, cobalt, manganese) series batteries are overdischarged, the voltage levels thereof are not necessarily maintained at 0 V, but may return to a certain level, and swelling or an abrupt increase in the internal resistance may not occur. Therefore, the NCM series batteries may not require (or necessitate) an overdischarge protecting function of a battery cell. The semiconductor device for protecting a battery cell according to an embodiment of the present invention includes an integrated circuit and a charge switch, which obviates the need for a discharge switch for protecting the battery cell from overdischarge. Accordingly, the semiconductor device according to an embodiment of the present invention can achieve a compact structure including only an integrated circuit and a charge switch, as compared to a conventional semiconductor device which includes an integrated circuit, a charge switch and a discharge switch. In addition, the use of the semiconductor device according to embodiments of the present invention allows for a protection circuit module and a battery pack improved or optimized by including substantially only necessary elements.

Such a semiconductor device will now be described with reference to FIGS. 1A through 2B.

Figure 1B:
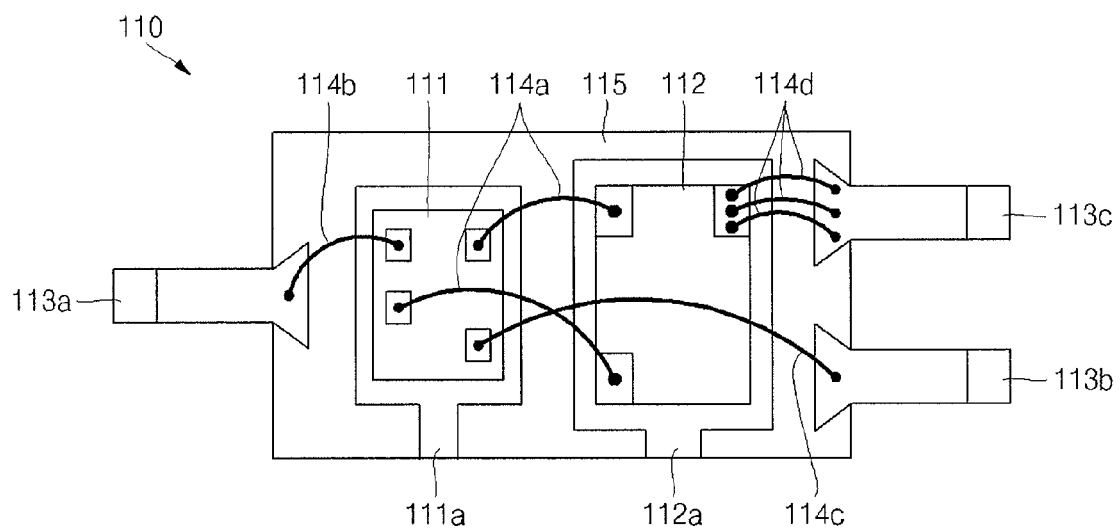
FIG. 1B shows another plan view of the semiconductor device of FIG. 1A with a portion of a sealing portion removed.
Figure 1C:
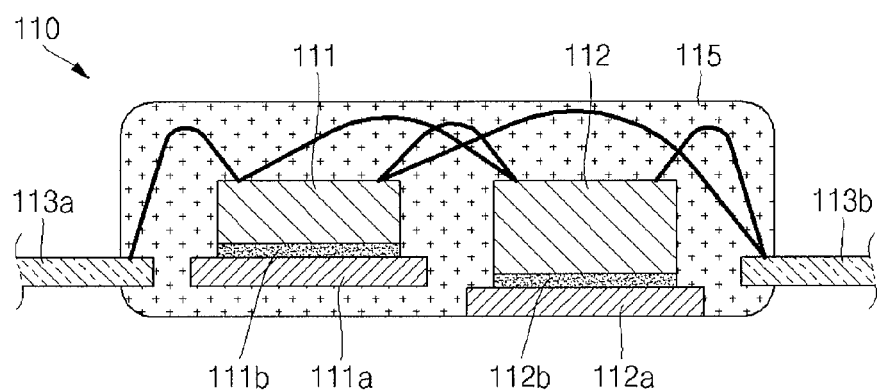
FIG. 1C shows a cross-sectional view of the semiconductor device of FIG. 1A.

FIG. 1A shows a plan view of a semiconductor device for protecting a battery cell according to an embodiment of the present invention. FIG. 1B shows another plan view of the semiconductor device of FIG. 1A with a portion of a sealing portion removed. FIG. 1C shows a cross-sectional view of the semiconductor device of FIG. 1A.

Referring to FIGS. 1A through 1C, the semiconductor device 110 for protecting a battery cell includes an integrated circuit 111, charge switch 112, first leads 113a and 113b, a second lead 113c, a plurality of conductive wires 114a, 114b, 114c, and 114d, and a sealing portion 115.

The integrated circuit 111 is mounted on a first mounting board (e.g., an integrated circuit mounting board) 111a, and the mounting is performed by applying an insulating adhesive 111b to the first mounting board 111a. The first mounting board 111a is made of a conductive material, such as copper, copper alloy, iron, or equivalents thereof, but the material of the first mounting board 111a, according to aspects of embodiments of the present invention, is not limited thereto.

The integrated circuit 111 is electrically coupled to the battery cell and senses a voltage of the battery cell. In addition, when it is determined that the voltage of the battery cell is an overcharged voltage, the integrated circuit 111 outputs a control signal to interrupt charging. The integrated circuit 111 may include various integrated circuit elements formed thereon, including a voltage detector, a comparator, a time delay, a switch driver, a power supply, and so on. The integrated circuit 111 may be formed into a package type chip.

The integrated circuit 111 is electrically coupled to the charge switch 112 by at least one conductive wire 114a. The integrated circuit 111 is electrically coupled to the first leads 113a and 113b by one or more conductive wires 114b and 114c.

Here, the first leads 113a and 113b include a first sub lead 113a for supplying power to the integrated circuit 111 and a second sub lead 113b for sensing a voltage of the battery cell. The first leads 113a and 113b will be described with respect to the first sub lead 113a and the second sub lead 113b, respectively.

The charge switch 112 is mounted on a second mounting board (e.g., a charge switch mounting board) 112a and is attached thereto using a conductive adhesive 112b. The second mounting board 112a is made of the same material as the first mounting board 111a, for example, a conductive material. The second mounting board 112a may be made of, for example, copper, copper alloy, iron, or an equivalent thereof, but aspects of embodiments of the present invention are not limited thereto in view of the material of the second mounting board 112a. The second mounting board 112a is exposed outside the sealing portion 115 and serves as a conductive pad that can be coupled to the outside.

The charge switch 112 interrupts a charge path based on a control signal output from the integrated circuit 111. The charge switch 112 may be a bipolar junction transistor (BJT), a field effect transistor (FET), or a metal oxide semiconductor field effect transistor (MOSFET), but aspects of embodiments of the present invention are not limited thereto.

The charge switch 112 is electrically coupled to the second lead 113c by at least one conductive wire 114d. During charging or discharging of the battery cell, a large current may flow through the at least one conductive wire 114d.

The sealing portion 115 seals the integrated circuit 111, the charge switch 112, the first sub lead 113a, the second sub lead 113b, the second lead 113c and the plurality of conductive wires 114a, 114b, 114c, and 114d. Here, one end of each of the first sub lead 113a, the second sub lead 113b, and the second lead 113c protrudes outside the sealing portion 115. The battery cell protecting semiconductor device 110 is electrically coupled to the outside through the protruding portions of the first sub lead 113a, the second sub lead 113b, and the second lead 113c. The first sub lead 113a is arranged at one side of the sealing portion 115, and the second sub lead 113b and the second lead 113c are aligned with each other at the other side of the sealing portion 115 facing the first sub lead 113a.

The sealing portion 115 may be made of epoxy, silicon or an equivalent thereof, but aspects of embodiments of the present invention are not limited thereto.

As described above, as NCM batteries, which obviate the need for a discharge switch for protecting a battery cell from overdischarge, have in recent years come to widespread use, the battery cell protecting semiconductor device 110 according to embodiments of the present invention can be fabricated with only the integrated circuit 111 and the charge switch 112. Accordingly, a more compact semiconductor device can be achieved, compared to the conventional semiconductor including an integrated circuit, a charge switch, and a discharge switch. In addition, the manufacturing cost of the semiconductor device can be reduced by eliminating an unnecessary overdischarge switch.

Further, the charge switch 112 of the battery cell protecting semiconductor device 110 is configured such that the second mounting board 112a is exposed outside the sealing portion 115 and is coupled to the outside through the second mounting board 112a, thereby shortening a current path. In addition, the second mounting board 112a may also serve as a dissipation panel for dissipating heat.

Figure 2A:
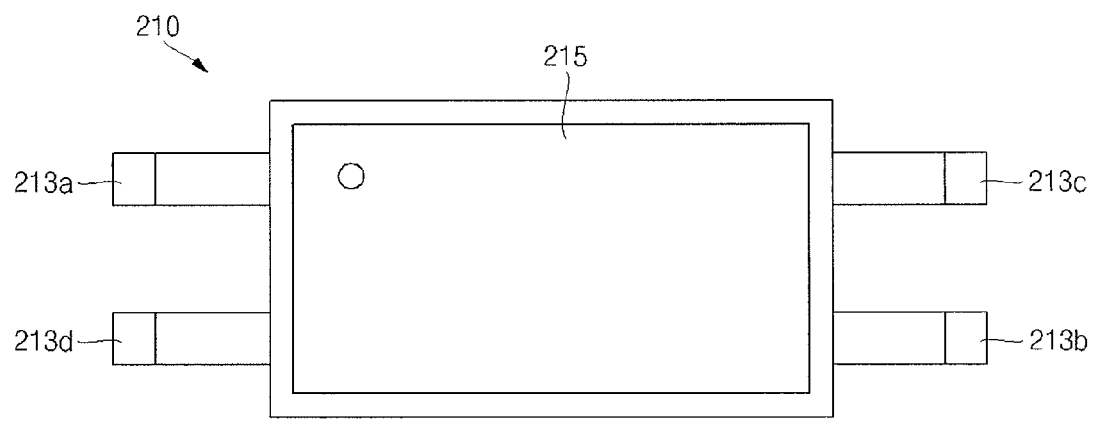
FIG. 2A shows a plan view of a semiconductor device for protecting a battery cell according to another embodiment of the present invention.
Figure 2B:
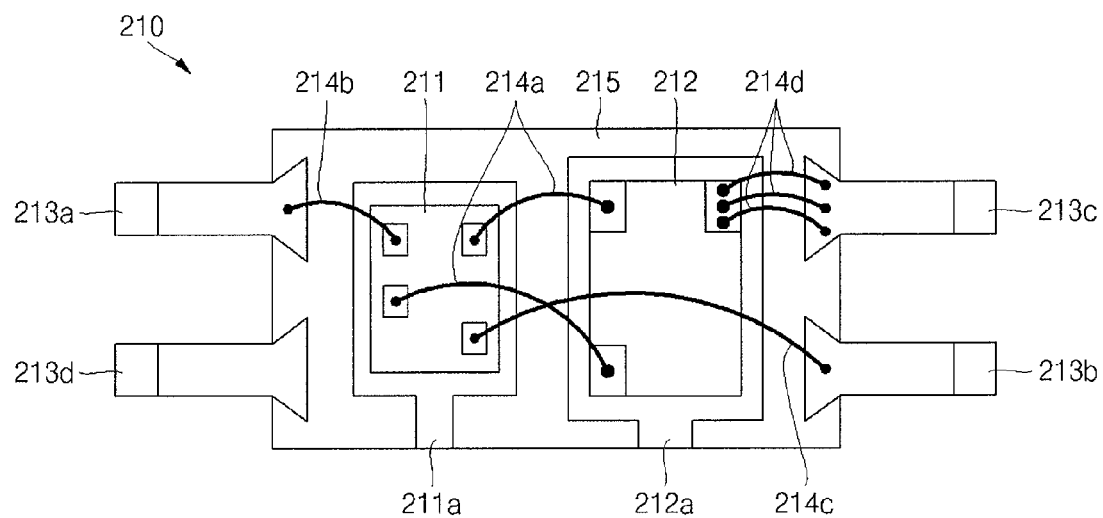
FIG. 2B shows another plan view of the semiconductor device of FIG. 2A with a portion of a sealing portion removed.

FIG. 2A shows a plan view of a semiconductor device for protecting a battery cell according to another embodiment of the present invention. FIG. 2B shows another plan view of the semiconductor device of FIG. 2A with a portion of a sealing portion removed.

A battery cell protecting semiconductor device 210 shown in FIGS. 2A and 2B is substantially the same as (or substantially similar to) the battery cell protecting semiconductor device 110 shown in FIGS. 1A through 1C, and the invention will be described with regard to only differences therebetween.

Referring to FIGS. 2A and 2B, the battery cell protecting semiconductor device 210 may further include a dummy lead 213d formed in a sealing portion 215.

The battery cell protecting semiconductor device 210 includes an integrated circuit 211, a charge switch 212, a first sub lead 213a, a second sub lead 213b, a second lead 213c, a dummy lead 213d, a plurality of conductive wires 214a, 214b, 214c, and 214d, and a sealing portion 215.

One end of each of the first sub lead 213a, the second sub lead 213b, the second lead 213c, and the dummy lead 213d protrudes outside the sealing portion 215. The battery cell protecting semiconductor device 210 is electrically coupled to the outside through the protruding portions of the first sub lead 213a, the second sub lead 213b, the second lead 213c, and the dummy lead 213d.

The first sub lead 213a is arranged at one side of the sealing portion 215, and the second sub lead 213b and the second lead 213c are aligned with each other at the other side of the sealing portion 215 facing the first sub lead 213a. In addition, the dummy lead 213d is formed at the same side as the first sub lead 213a and is aligned with the first sub lead 213a, thereby achieving structural balance. The dummy lead 213d is not electrically coupled to the integrated circuit 211 or the charge switch 212.

As described above, since the dummy lead 213d is formed at the same side as the first sub lead 213a and is aligned with the first sub lead 213a, structural balance is achieved.

Figure 3A:
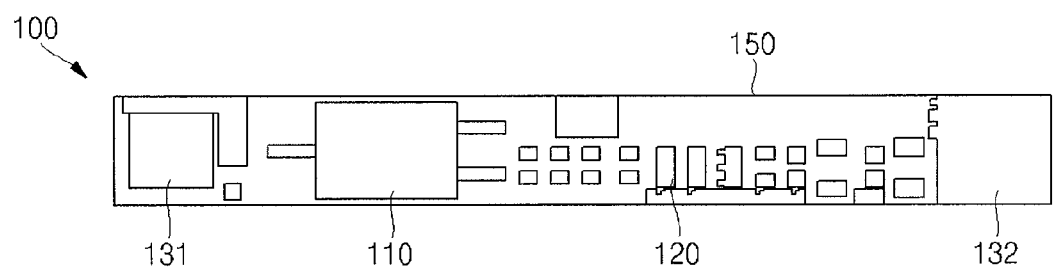
FIG. 3A shows a plan view of a protection circuit module having a semiconductor device for protecting a battery cell mounted therein, according to an embodiment of the present invention.
Figure 3B:
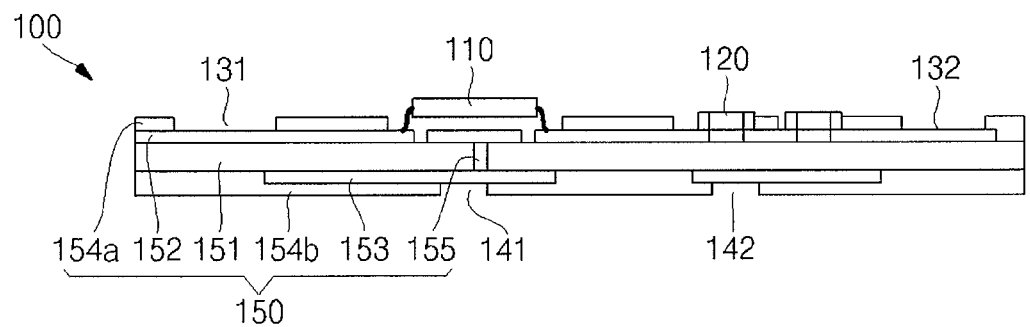
FIG. 3B shows a cross-sectional view of the protection circuit module of FIG. 3A.

FIG. 3A shows a plan view of a protection circuit module having a semiconductor device for protecting a battery cell mounted therein, according to an embodiment of the present invention. FIG. 3B shows a cross-sectional view of the protection circuit module of FIG. 3A.

The protection circuit module 100 includes a semiconductor device 110 for protecting a battery cell, a plurality of passive elements 120, battery terminals 131 and 132, pack terminals 141 and 142, and a printed circuit board 150.

The semiconductor device 110 is mounted on the printed circuit board 150. The semiconductor device 110 senses a voltage of the battery cell and interrupts a charge path when the sensed voltage is at a level indicating that the battery cell is overcharged. Even when the recently developed NCM battery is overdischarged, its voltage level returns to a certain level, (e.g., a higher level) after a period (e.g., a predetermined period) of time without occurrence of expansion or sharp increase in the internal resistance, so that a function of the semiconductor device 110 protecting the battery cell from overdischarge is not required. Accordingly, the semiconductor device 110 can be implemented in a more compact size.

The semiconductor device 110 includes an integrated circuit 111 (see FIGS. 1B and 1C) that senses a voltage of the battery cell and outputs a control signal according to the sensed voltage, and a charge switch 112 that interrupts a charge path according to the control signal output from the integrated circuit 111.

The passive elements 120 are mounted on the printed circuit board 150. The passive elements 120 may include resistors (e.g., R2 shown in FIG. 4), capacitors (e.g., C1 or C2 shown in FIG. 4), inductors, diodes, and so on, but aspects of embodiments of the present invention are not limited thereto.

The battery terminals 131 and 132 are formed in the printed circuit board 150 and are coupled to wiring pattern 152 formed on the printed circuit board 150. Positive and negative terminals of the battery cell may be connected to the battery terminals 131 and 132, respectively.

The pack terminals 141 and 142 are formed at the printed circuit board 150 and are coupled to wiring pattern 153 formed on the printed circuit board 150. An external system, such as a charger, may be coupled to the pack terminals 141 and 142.

The printed circuit board 150 includes a plurality of wiring patterns 152 and 153 formed on its top and bottom surfaces around an insulating layer 151 having a substantially plate shape. Referring back to FIG. 3B, the insulating layer 151 has a single-layer structure. However, the insulating layer 151 may have a multi-layered structure depending on the density of the wiring patterns 152 and 153. The wiring patterns 152 and 153 formed on the top and bottom surfaces of the printed circuit board 150 may be connected to each other through conductive vias 155. In addition, the wiring patterns 152 and 153 may be coated with copper coatings 154a and 154b to be protected from external impacts.

As described above, since the battery cell protecting semiconductor device 110 having the integrated circuit 111 and the charge switch 112 formed into a single package is mounted on the printed circuit board 150, the printed circuit board 150 includes a simplified wiring pattern configuration without separate wiring patterns for connecting the integrated circuit 111 with the charge switch 112. Consequently, the size of the printed circuit board 150 can be reduced.

Figure 4:
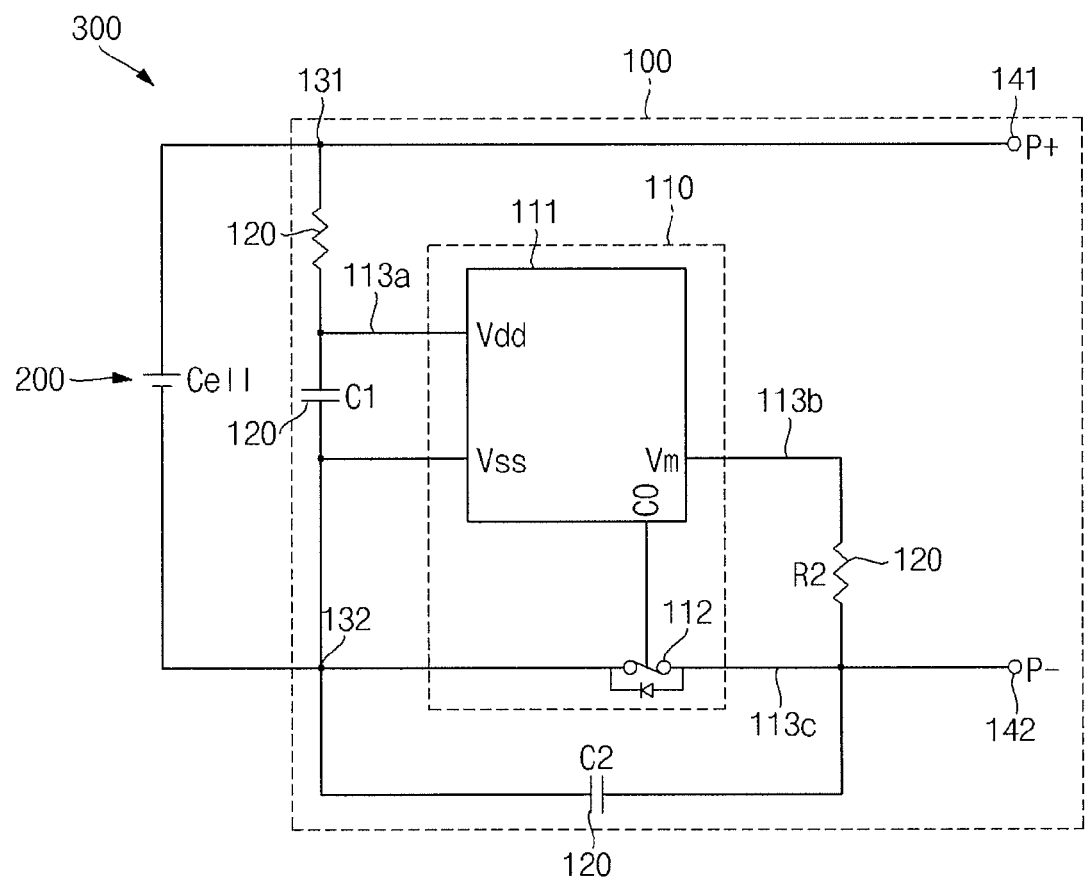
FIG. 4 shows a circuit diagram illustrating a protection circuit module having a semiconductor device for protecting a battery cell mounted therein and a battery pack using the protection circuit module according to an embodiment of the present invention.

FIG. 4 shows a circuit diagram illustrating a protection circuit module having a semiconductor device for protecting a battery cell mounted therein and a battery pack using the protection circuit module according to an embodiment of the present invention.

Referring to FIG. 4, the battery pack 300 includes a battery cell 200, and a protection circuit module 100 coupled to the battery cell 200.

The battery cell 200 is a rechargeable battery having a positive electrode and a negative electrode. The battery cell 200 may be a lithium ion secondary battery, a lithium polymer secondary battery, or equivalents thereof, but aspects of embodiments of the present invention are not limited thereto. The battery cell 200 may be coupled to battery terminals 131 and 132 formed in the protection circuit module 100.

When the battery cell 200 is at an overcharged voltage level, the protection circuit module 100 coupled to the battery cell 200 interrupts a charge path.

The protection circuit module 100 includes a semiconductor device 110 for protecting a battery cell, and a plurality of passive elements 120. In more detail, the protection circuit module 100 includes an integrated circuit 111 that senses an overcharge of the battery cell 200 and outputs a control signal, a charge switch 112 that interrupts a charge path based on the control signal output from the integrated circuit 111, a first sub lead 113a, a second sub lead 113b, and a second lead 113c, which couple the integrated circuit 111 and the charge switch 112 to external terminals, and the plurality of passive elements 120.

One end of the first sub lead 113a may be electrically coupled to the integrated circuit 111, and the other end thereof may be electrically coupled to the battery terminal 131 and a pack terminal 141 through wiring.

One end of the second sub lead 113b may be electrically coupled to the integrated circuit 111, and the other end thereof may be electrically coupled to the pack terminal 142 through wiring.

One end of the second lead 113c may be electrically coupled to the integrated circuit 111 via the charge switch 112, and the other end thereof may be electrically coupled to a pack terminal 142 through wiring.

The battery terminals 131 and 132 and the pack terminals 141 and 142 may further be provided in the protection circuit module 100.

The pack terminals 141 and 142 may be coupled to the positive and negative terminals of the battery cell 200, respectively, through the wiring. In addition, an external system, such as a charger, may be coupled to the pack terminals 141 and 142.

The passive elements 120 may include resistors (e.g., R2), capacitors (e.g., C1 or C2), inductors, diodes, and so on, but aspects of embodiments of the present invention are not limited thereto.

The battery pack 300 having the aforementioned configuration operates as follows.

When the charger is connected to the pack terminals 141 and 142 of the battery pack 300 to charge the battery cell 200, the integrated circuit 111 of the protection circuit module 100 senses a charge voltage of the battery cell 200. If the sensed charge voltage of the battery cell 200 is normal, the integrated circuit 111 outputs a control signal to control the charge switch 112 to be turned on. Here, the battery cell 200 undergoes normal charging.

As a sensing result, when it is determined that the charge voltage of the battery cell 200 is at an overcharge level, the integrated circuit 111 outputs a control signal to control the charge switch 112 to be turned off. Here, since a parasitic diode at the charge switch 112 is formed in an opposite direction to a direction of a charging current, the charging of the battery cell 200 is interrupted.

As described above, the battery pack 300 having the protection circuit module 100 eliminates an unnecessary overdischarge protecting function from the battery design, thereby reducing the manufacturing cost and achieving a compact size of the battery pack 300.

Although the semiconductor device for protecting a battery cell, the protection circuit module, and the battery pack having the protection circuit module according to a few embodiments of the present invention have been shown and described, it would be appreciated by those skilled in the art that changes may be made in these embodiments without departing from the principles and spirit of the invention, the scope of which is defined in the claims and their equivalents.

While aspects of the present invention have been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A semiconductor device comprising:
   an integrated circuit configured to sense a voltage of a battery cell and outputs a control signal;
   a charge switch electrically coupled to the integrated circuit and configured to interrupt a charge path according to the control signal output from the integrated circuit;
   a first lead electrically coupled to the integrated circuit;
   a second lead electrically coupled to the charge switch; and
   a sealing portion that seals the integrated circuit, charge switch, the first lead, the second lead, and a dummy lead,
   wherein the sealing portion comprises a charge switch mounting board and the charge switch is mounted on the charge switch mounting board,
   wherein the charge switch mounting board is exposed outside the sealing portion so that the charge switch mounting board serves as a conductive pad that can be coupled to the outside,
   wherein the dummy lead is electrically isolated from all circuits sealed by the sealing portion, and
   wherein the integrated circuit and the charge switch are located in the sealing portion and are a single package.

2. The semiconductor device of claim 1, wherein the integrated circuit and the charge switch are coupled to each other by at least one conductive wire.

3. The semiconductor device of claim 1, wherein the integrated circuit and the first lead are coupled to each other by at least one conductive wire.

4. The semiconductor device of claim 1, wherein the charge switch and the second lead are coupled to each other by at least one conductive wire.

5. The semiconductor device of claim 1, wherein the first lead and the second lead protrude outside the sealing portion.

6. The semiconductor device of claim 1, wherein the at least one first lead comprises a first sub lead for supplying power to the integrated circuit, and a second sub lead for sensing a voltage of the battery cell.

7. The semiconductor device of claim 6, wherein the first sub lead is arranged at one side of the sealing portion, and the second sub lead and the second lead are aligned with each other at the other side of the sealing portion facing the first sub lead.

8. The semiconductor device of claim 6, wherein the first sub lead is electrically coupled to a battery terminal and a pack terminal.

9. The, semiconductor device of claim 6, wherein the second sub lead is electrically coupled to a pack terminal.

10. The semiconductor device of claim 1, wherein the second lead is electrically coupled to a pack terminal.

11. The semiconductor device of claim 1, wherein the sealing portion comprises an integrated circuit mounting board and the integrated circuit is mounted on the integrated circuit mounting board.

12. The semiconductor device of claim 11, wherein the integrated circuit mounting board is coupled to the integrated circuit using an insulating adhesive.

13. The semiconductor device of claim 1, wherein the charge switch mounting board is coupled to the charge switch using a conductive adhesive.

14. The semiconductor device of claim 1, wherein the dummy lead protrudes outside the sealing portion.

15. The semiconductor device of claim 1, wherein the dummy lead is formed at the same side of the sealing portion as the first lead of the sealing portion.

16. A battery pack comprising:
   a protection circuit module comprising the semiconductor device as claimed in claim 1, the semiconductor device being mounted on a printed circuit board; and
   a battery cell electrically coupled to the protection circuit module.

17. The battery pack of claim 16, wherein the printed circuit board further comprises:
   a battery terminal electrically coupled to the battery cell; and
   a pack terminal electrically coupled to an external system.

* * * * *